(12) United States Patent
Tsuji et al.

(10) Patent No.: US 9,360,752 B2
(45) Date of Patent: Jun. 7, 2016

(54) PATTERN FORMATION METHOD

(71) Applicant: KABUSHIKI KAISHA TOSHIBA, Minato-ku, Tokyo (JP)

(72) Inventors: Masatoshi Tsuji, Kanagawa-ken (JP); Tetsuro Nakasugi, Kanagawa-ken (JP); Masayuki Hatano, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 407 days.

(21) Appl. No.: 13/939,417

(22) Filed: Jul. 11, 2013

(65) Prior Publication Data
US 2014/0246808 A1 Sep. 4, 2014

(30) Foreign Application Priority Data
Mar. 4, 2013 (JP) .................................. 2013-041993

(51) Int. Cl.
*G03F 7/00* (2006.01)
*B29C 59/02* (2006.01)
*B82Y 40/00* (2011.01)

(52) U.S. Cl.
CPC ......... *G03F 7/0002* (2013.01); *B29C 2059/023* (2013.01); *B82Y 40/00* (2013.01)

(58) Field of Classification Search
None
See application file for complete search history.

(56) References Cited

U.S. PATENT DOCUMENTS

| 8,709,955 B2* | 4/2014 | Kobayashi | G03F 7/0002 118/620 |
| 2008/0299467 A1 | 12/2008 | Kim et al. | |
| 2010/0233377 A1* | 9/2010 | Aoki | B29C 59/022 429/355 |
| 2012/0049396 A1* | 3/2012 | Tsutsui | B82Y 10/00 264/40.1 |

FOREIGN PATENT DOCUMENTS

JP 2008-149589 7/2008

OTHER PUBLICATIONS

Notification of Reason(s) for Refusal issued by the Japanese Patent Office on May 25, 2015, for Japanese Patent Application No. 2013-041993, and English-language translation thereof.

* cited by examiner

*Primary Examiner* — Benjamin Schiffman
(74) *Attorney, Agent, or Firm* — Finnegan, Henderson, Farabow, Garrett & Dunner LLP

(57) ABSTRACT

According to one embodiment, a pattern formation method is disclosed. The method is configured to transfer a shape of a pattern to a plurality of shot regions of an object using a mold including a first pattern region and a second pattern region aligned with the first pattern region. The method can include transferring the shape of the pattern to each of the plurality of shot regions sequentially in a first direction from the first pattern region toward the second pattern region when the shape of the pattern is transferred using the first pattern region. The method can include transferring the shape of the pattern to each of the plurality of shot regions sequentially in a second direction from the second pattern region toward the first pattern region when the shape of the pattern is transferred using the second pattern region.

13 Claims, 16 Drawing Sheets

PATTERN FORMATION METHOD

CROSS-REFERENCE TO RELATED APPLICATIONS

This application is based upon and claims the benefit of priority from Japanese Patent Application No. 2013-041993, filed on Mar. 4, 2013; the entire contents of which are incorporated herein by reference.

FIELD

Embodiments described herein relate generally to a pattern formation method and a pattern formation device.

BACKGROUND

As one of pattern formation methods forming a fine pattern, an imprint method has attracted attention, which uses an original plate (mold) provided with a concave and convex shape of a transferred pattern. In the imprint method, for example, a photo-curing resin is applied on a substrate on which the pattern shape is transferred, and the concave-convex pattern of the mold is contacted the resin. After the resin is cured in the state, the mold is separated from the resin, and thus the shape of the concave-convex pattern of the mold is transferred to the resin. The imprint method using a mold (so called mold for multi-shot) provided with a plurality of transfer regions on one base is advantage in saving the effort of exchanging the mold in the imprint corresponding to each shot region. In the pattern formation method, it is important not to destroy the previously formed pattern by the mold.

DETAILED DESCRIPTION

Figure 1:
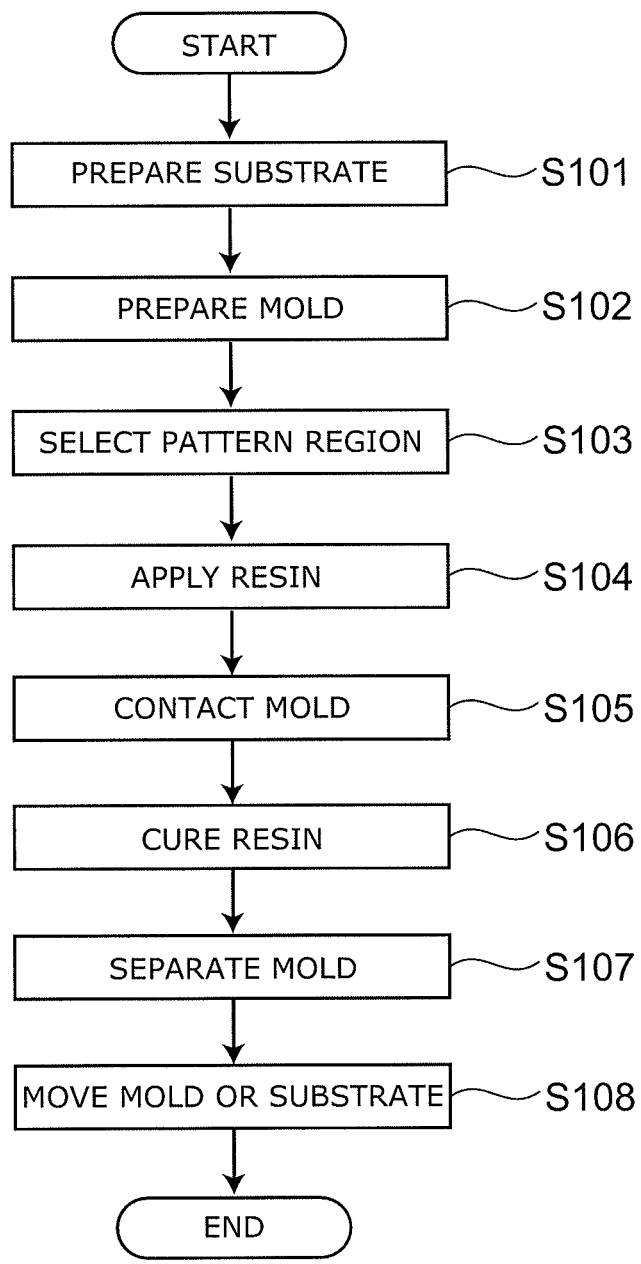
FIG. 1 is a flow chart illustrating a pattern formation method according to a first embodiment.

According to one embodiment, a pattern formation method is disclosed. The method is configured to transfer a shape of a pattern to a plurality of shot regions of an object using a mold including a first pattern region and a second pattern region aligned with the first pattern region. The method can include transferring the shape of the pattern to each of the plurality of shot regions sequentially in a first direction from the first pattern region toward the second pattern region when the shape of the pattern is transferred using the first pattern region. The method can include transferring the shape of the pattern to each of the plurality of shot regions sequentially in a second direction from the second pattern region toward the first pattern region when the shape of the pattern is transferred using the second pattern region.

Various embodiments will be described hereinafter with reference to the accompanying drawings. In the following description, similar members are marked with like reference numerals, and a detailed description of the members previously described is omitted as appropriate.

First Embodiment

FIG. 1 is a flow chart illustrating a pattern formation method according to a first embodiment.

Figure 2A:
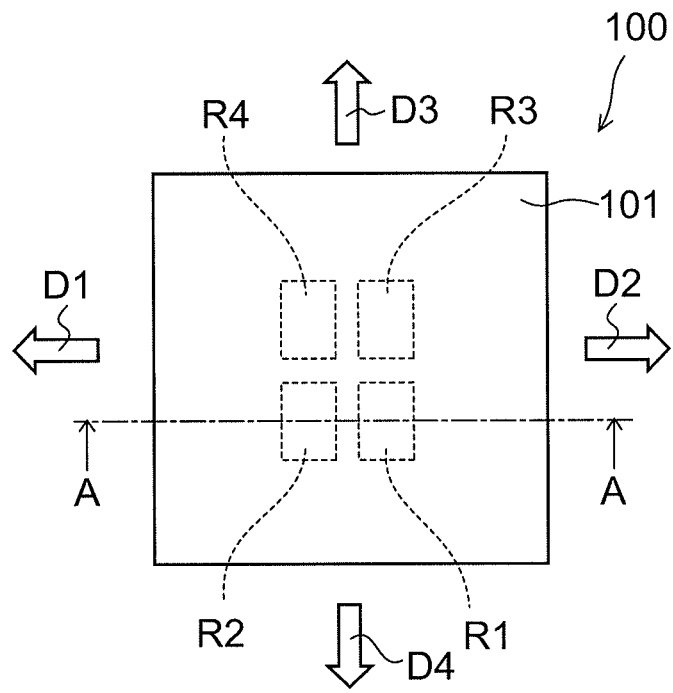
FIG. 2A to FIG. 2C are schematic views illustrating a mold used for the pattern formation method according to the first embodiment.
Figure 2B:
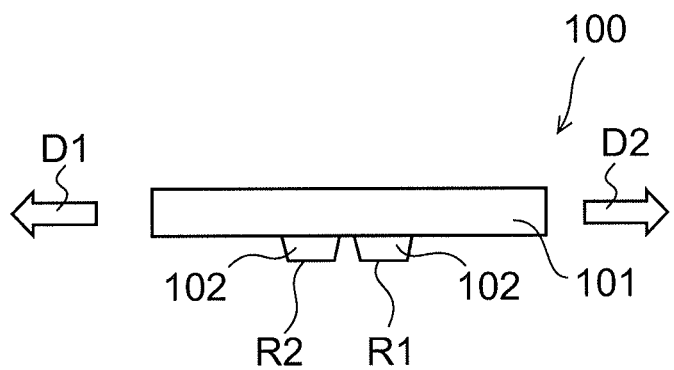
Figure 2C:
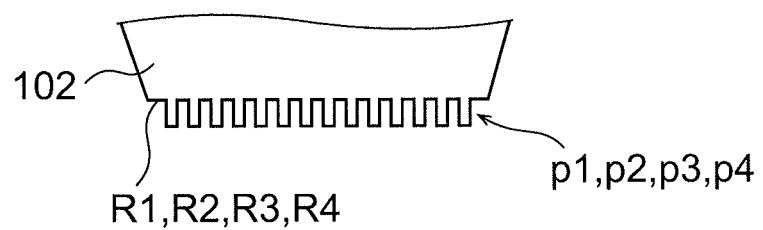

FIG. 2A to FIG. 2C are schematic views illustrating a mold used for the pattern formation method according to the first embodiment.

FIG. 2A shows a schematic plan view of a mold 100. FIG. 2B shows a A-A cross-sectional view shown in FIG. 2A. FIG. 2C shows a schematic cross-sectional view expanding a part of a concave-convex pattern p1.

As shown in FIG. 1, the pattern formation method according to the first embodiment includes a process of preparing a substrate (step S101), a process of preparing a mold (step S102), a process of selecting a shot region (step S103), a process of applying a resin (step S104), a process of contacting the mold (step S105), a process of curing a resin (step S106), a process of detaching the mold (step S107), and a process of moving the mold or the substrate (step S108).

Here, the mold 100 used in the embodiment will be described.

As shown in FIGS. 2A and 2B, the mold 100 has a first pattern R1 provided on a base 101 such as glass etc., and a second pattern R2 aligned with the first pattern R1. In the example shown in FIG. 2A, the mold 100 has a third pattern R3 and a fourth pattern R4 in addition to the first pattern R1 and the second pattern R2.

The third pattern R3 is aligned with the first pattern R1. A line connecting the first pattern R1 and the third pattern R3 is orthogonal to a line connecting the first pattern R1 and the second pattern R2.

The fourth pattern R4 is aligned with the second pattern R2. A line connecting the second pattern R2 to the fourth pattern R4 is orthogonal to a line connecting the second pattern R2 to the first pattern R1. That is, the mold 100 has a plurality of pattern regions disposed in 2×2 array.

As shown in FIG. 2C, a concave-convex pattern p1 is provided on the first pattern region R1, a concave-convex pattern p2 is provided on the second pattern region R2, a concave-convex pattern p3 is provided on the third pattern region R3 and a concave-convex pattern p4 is provided on the third pattern region R4. Each of the concave-convex patterns p1, p2, p3, and p4 is provided on a surface of a pedestal 102 protruding from the base 101. The shape of the concave-convex patterns p1, p2, p3 and p4 may be different from each other, and may be the same.

The shape of the concave-convex pattern p1 may be the same as a part of the concave-convex patterns p2, p3 and p4. The shape of the concave-convex pattern p2 may be the same as a part of the concave-convex patterns p1, p3 and p4. The shape of the concave-convex pattern p3 may be the same as a part of the concave-convex patterns p1, p2 and p4. The shape of the concave-convex pattern p4 may be the same as a part of the concave-convex patterns p1, p2 and p3.

In the mold 100, the shape of the pattern provided in the first pattern region R1 is not transferred simultaneously with the shape of the pattern provided in the second pattern region R2. Consequently, a distance between the mutually adjacent first pattern R1 and second pattern R2 may be different from a distance between mutually adjacent two shot regions. A distance between the mutually adjacent third pattern R3 and fourth pattern R4 may be different from a distance between mutually adjacent two shot regions. A distance between the mutually adjacent first pattern R1 and third pattern R3 may be different from a distance between mutually adjacent two shot regions. A distance between the mutually adjacent second pattern R2 and fourth pattern R4 may be different from a distance between mutually adjacent two shot regions.

For example, in the first pattern region R1 of the mold 100, the shape of the concave-convex pattern p1 is transferred onto a first layer of the object such as a substrate etc. In the second pattern region R2, the shape of the concave-convex pattern p2 is transferred onto a second layer on the first layer. In the third pattern region R3, the shape of the concave-convex pattern p3 is transferred onto a third layer on the second layer. In the fourth pattern region R4, the shape of the concave-convex pattern p4 is transferred onto a fourth layer on the third layer.

In the case where the shape of the concave-convex pattern p1 is transferred to the object using the first pattern region R1 of the mold 100 in the pattern formation method according to the embodiment, the shape of the concave-convex pattern p1 is transferred to each of the plurality of shot regions sequentially in a first direction D1 from the first pattern region R1 toward the second pattern region R2.

On the other hand, in the case where the shape of the concave-convex pattern p1 is transferred to the object using the second pattern region R2 of the mold 100, the shape of the concave-convex pattern p1 is transferred to each of shot regions sequentially in a second direction D2 from the second pattern region R2 toward the first pattern region R1.

If the shape of the pattern is transferred to each of the plurality of shot regions sequentially like this, the patterns are surly formed without destruction of the previously formed pattern by the mold 100.

Figure 3A:
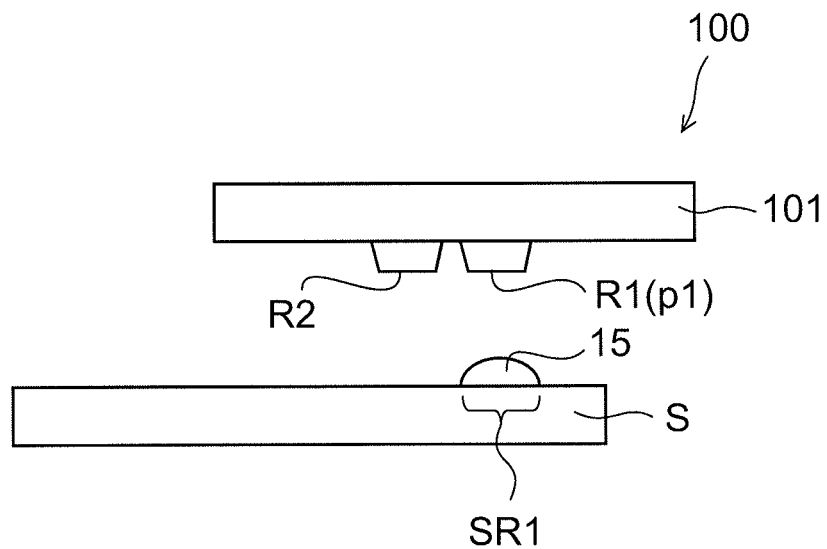
FIG. 3A to FIG. 3C are schematic cross-sectional views illustrating the pattern formation method using the mold.
Figure 3B:
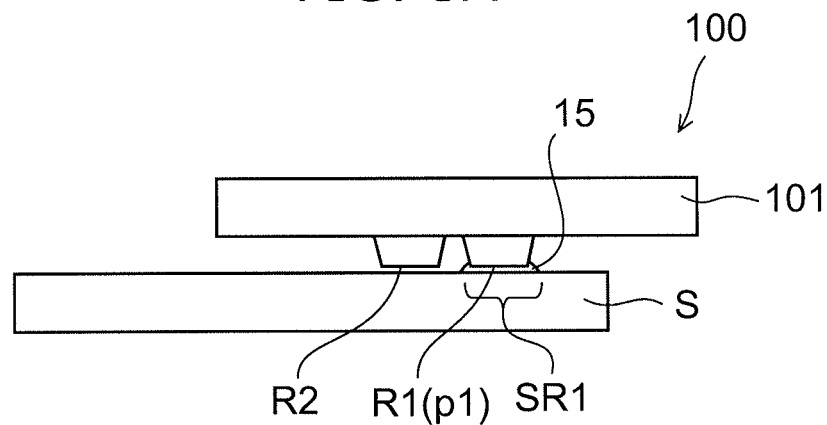
Figure 3C:
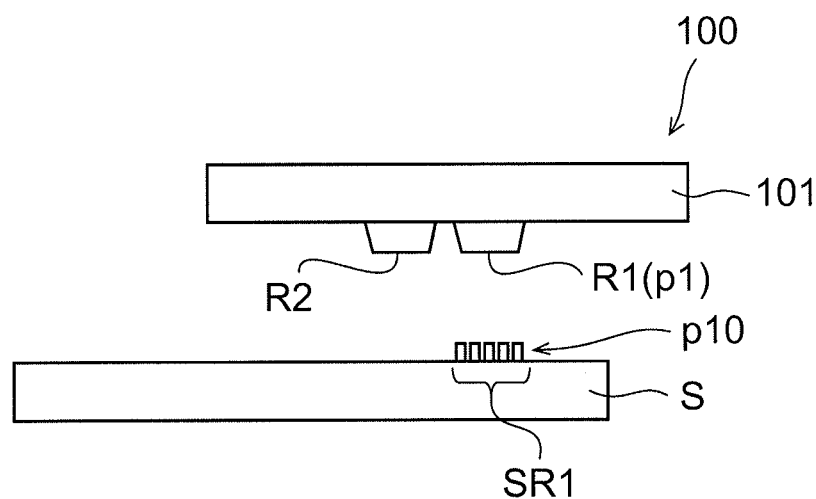

FIGS. 3A to 3C are schematic cross-sectional views illustrating the pattern formation method using the mold.

FIGS. 3A to 3C show the pattern formation method using the mold 100 shown in FIG. 2. Here, the example of transferring the shape of the pattern to a first shot region SR1 of a substrate S using the first pattern region R1 is shown.

First, as shown in FIG. 3A, a resin 15 is applied on the first shot region SR1 of the substrate S (step S104 in FIG. 1). The resin 15 includes, for example, a photo-curing resin cured by irradiation with a ultra-violet ray. Next, the mold 100 is placed on the substrate S, and position alignment between the mold 100 and the substrate S is performed.

Next, as shown in FIG. 3B, the mold 100 is relatively close to the substrate S, and the concave-convex pattern p1 of the first pattern region R1 is contacted the resin 15 (step S105 in FIG. 1). In this state, a stress is applied to a periphery of the mold 100 as necessary, and the position alignment of the mold 100 is performed. Next, the resin 15 is irradiated with, for example, a ultra-violet ray and the resin 15 is cured (step S106 in FIG. 1).

Next, as shown in FIG. 3C, the mold 100 is separated from the resin 15 (step S107 in FIG. 1). This transfers the shape of the concave-convex pattern p1 of the first pattern region R1 to the resin 15. A pattern p10 is formed in the first shot region SR1 on the substrate S by transferring the shape of the concave-convex pattern p1 to the resin 15.

In the following description, forming the pattern includes processes shown in FIGS. 3A to 3C (step S104 to step S107 in FIG. 1).

Next, a specific example of the pattern formation method according to the embodiment will be described.

FIG. 4A to FIG. 5D are schematic cross-sectional views showing the specific example of the pattern formation method.

FIG. 4A to FIG. 5D show the example of forming the pattern p10 and a pattern p20 using the first pattern region R1 and the second pattern region R2.

Figure 4A:
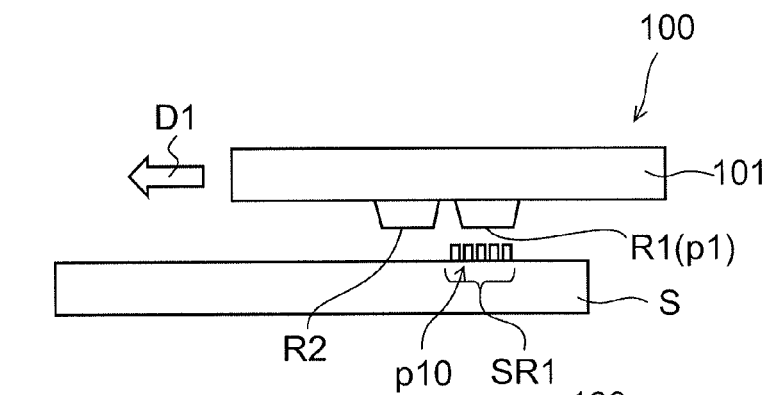
FIG. 4A to FIG. 5D are schematic cross-sectional views showing a specific example of the pattern formation method.

First, as shown in FIG. 4A, the substrate S and the mold 100 are prepared (step S101 to step S102 in FIG. 1). Next, the pattern region of the mold 100 is selected (step S103 in FIG. 1). In the specific example, first, the first pattern region R1 is selected. The shape of the concave-convex pattern p1 of the first pattern region R1 is transferred to the first shot region SR1 of the substrate S to form the pattern 10p (step S104 to step S107 in FIG. 1).

Figure 4B:
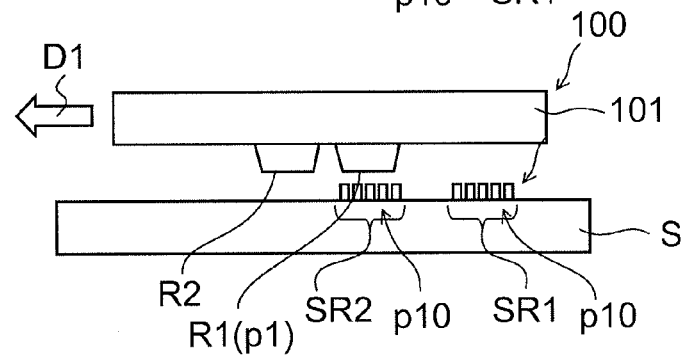

Next, as shown in FIG. 4B, the region for forming the pattern p10 using the first pattern region R1 is moved in the first direction D1. In order to move the region for forming the pattern p10, the mold 100 is moved in the first direction D1. The substrate S may be moved in an opposite direction to the first direction D1 while fixing the mold 100. The mold 100 and the substrate S may be moved in mutually opposite directions. In the specific example, the mold 100 is moved in the first direction D1. After moving the mold 100, the pattern p10 is formed in the second shot region SR2 adjacent to the first shot region SR1 in the first direction D1. When the pattern p10 is formed in the second shot region SR2, the pattern p10 previously formed in the first shot region SR1 is not destroyed by the second pattern region R2 of the mold 100.

Figure 4C:
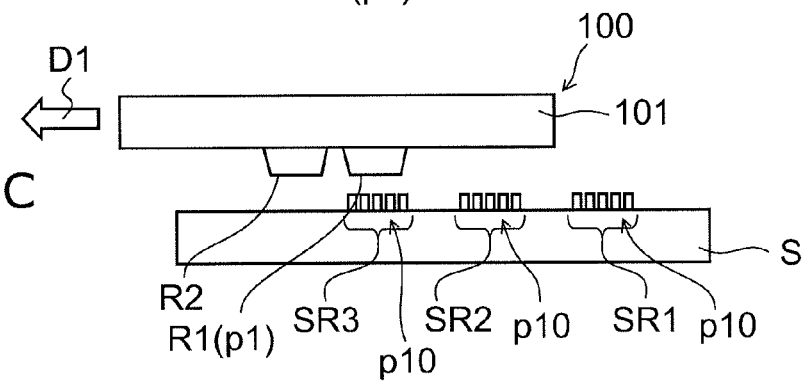

Next, as shown in FIG. 4C, the region for forming the pattern p10 using the first pattern region R1 is moved in the first direction D1. In the specific example, the mold 100 is moved in the first direction D1. After moving the mold 100, the pattern p10 is formed in the third shot region SR3 adjacent to the second shot region SR2 in the first direction D1. When the pattern p10 is formed in the third shot region SR3, the pattern p10 previously formed in the first shot region SR1 and the pattern p10 previously formed in the second shot region SR2 are not destroyed by the second pattern region R2 of the mold 100.

Figure 4D:
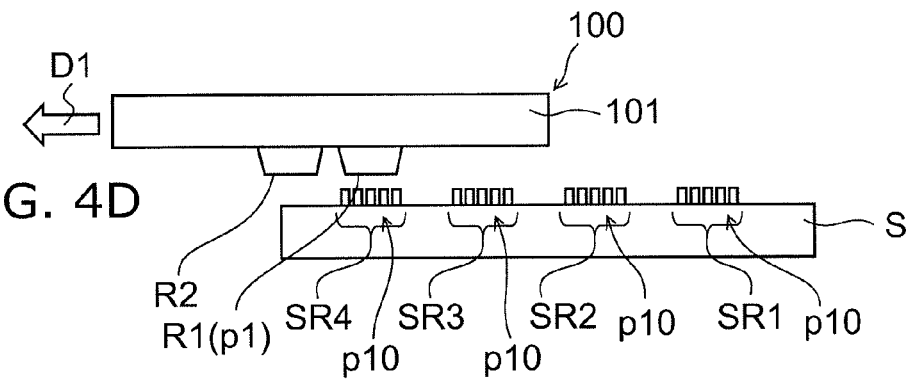

Next, as shown in FIG. 4D, the region for forming the pattern p10 using the first pattern region R1 is moved in the first direction D1. In the specific example, the mold 100 is moved in the first direction D1. After moving the mold 100, the pattern p10 is formed in the fourth shot region SR4 adjacent to the third shot region SR3 in the first direction D1. When the pattern p10 is formed in the fourth shot region SR4, the pattern p10 previously formed in the first shot region SR1, the pattern p10 previously formed in the second shot region SR2 and the pattern p10 previously formed in the third shot region SR3 are not destroyed by the second pattern region R2 of the mold 100.

In the examples shown in FIGS. 4A to 4D, the patterns p10 are formed in four shot regions of the first shot region SR1 to the fourth shot region SR4 on the substrate S, the same applies to the case where the patterns p10 are formed in still more shot regions. This forms the pattern p10 in the first layer L1 on the substrate S.

Figure 5A:
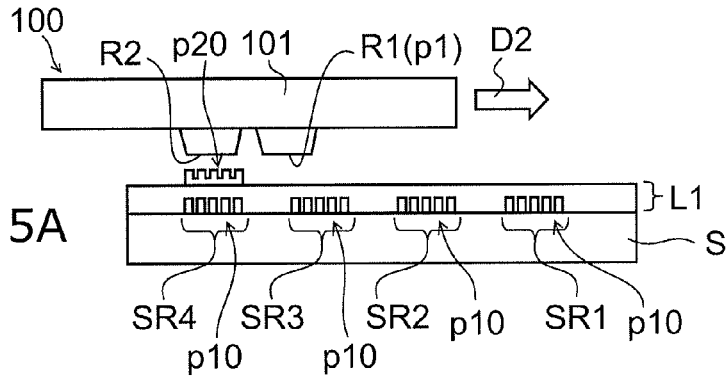

Next, as shown in FIG. 5A, the pattern p10 in the first layer L1 is covered with an insulating film 50. Next, the second pattern region R2 of the mold 100 is selected (step S103 in FIG. 1). The shape of the concave-convex pattern p2 in the second pattern region R2 is transferred to the fourth shot region SR4 on the substrate to form the pattern p20 (step S104 to step S107 in FIG. 1).

Figure 5B:
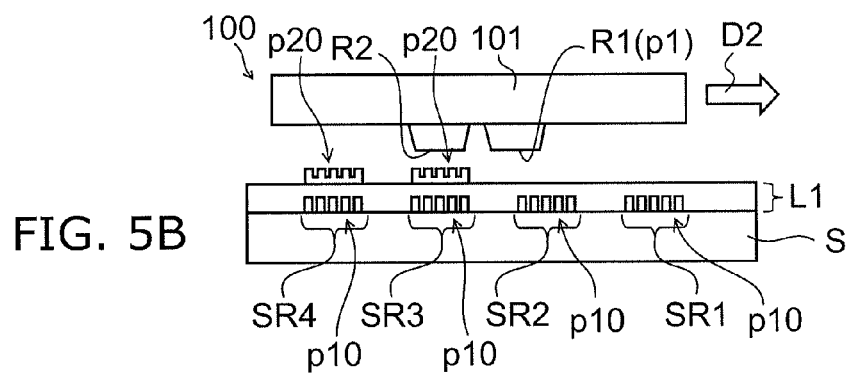

Next, as shown in FIG. 5B, the region for forming the pattern p20 using the first pattern region R1 is moved in the second direction D2. In order to move the region for forming the pattern p20, the mold 100 is moved in the second direction D2. The substrate S may be moved in an opposite direction to the second direction D2 while fixing the mold 100. The mold 100 and the substrate S may be moved in mutually opposite directions. In the specific example, the mold 100 is moved in the second direction D2. After moving the mold 100, the pattern p20 is formed in the third shot region SR3 adjacent to the fourth shot region SR4 in the second direction D2. When the pattern p20 is formed in the third shot region SR3, the pattern p20 previously formed in the fourth shot region SR4 is not destroyed by the first pattern region R1 of the mold 100.

Figure 5C:
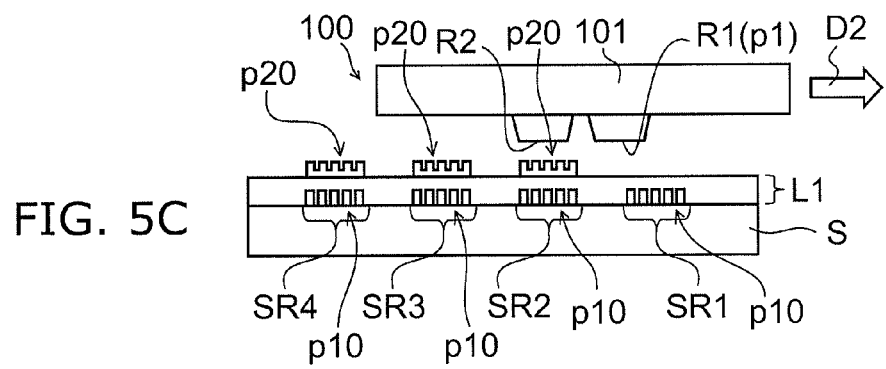

Next, as shown in FIG. 5C, the region for forming the pattern p20 using the second pattern region R2 is moved in the second direction D2. In the specific example, the mold 100 is moved in the second direction D2. After moving the mold 100, the pattern p20 is formed in the second shot region SR2 adjacent to the third shot region SR3 in the second direction D2. When the pattern p20 is formed in the second shot region SR2, the pattern p20 previously formed in the fourth shot region SR4 and the pattern p20 previously formed in the third shot region SR3 are not destroyed by the first pattern region R1 of the mold 100.

Figure 5D:
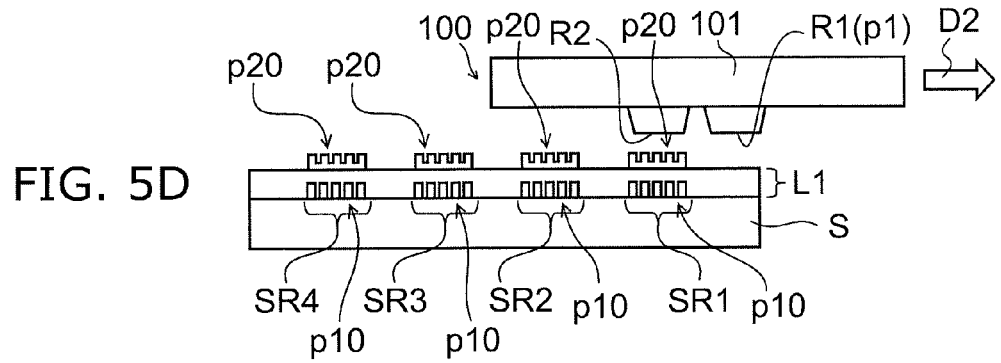

Next, as shown in FIG. 5D, the region for forming the pattern p20 using the second pattern region R2 is moved in the second direction D2. In the specific example, the mold 100 is moved in the second direction D2. After moving the mold 100, the pattern p20 is formed in the first shot region SR1 adjacent to the second shot region SR2 in the second direction D2. When the pattern p20 is formed in the first shot region SR1, the pattern p20 previously formed in the fourth shot region SR4, the pattern p20 previously formed in the third shot region SR3 and the pattern p20 previously formed in the second shot region SR2 are not destroyed by the first pattern region R1 of the mold 100.

In the examples shown in FIGS. 5A to 5D, the patterns p20 are formed in four shot regions of the first shot region SR1 to the fourth shot region SR4 on the substrate S, the same applies to the case where the patterns p20 are formed in still more shot regions. This forms the pattern p20 in the second layer L2 on the first layer L1.

Here, a reference example is described.

FIGS. 6A to 6D are schematic cross-sectional views illustrating a pattern formation method according to a reference example.

FIGS. 6A to 6D shows the case where the order of forming the pattern 20 is set in the first direction D1 opposite to the second direction D2 as shown in FIGS. 5A to 5D.

Figure 6A:
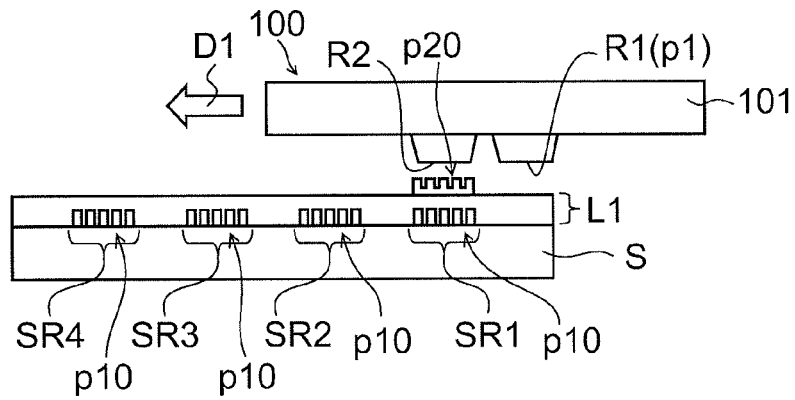
FIG. 6A to FIG. 6D are schematic cross-sectional views illustrating a pattern formation method according to a reference example.
Figure 6B:
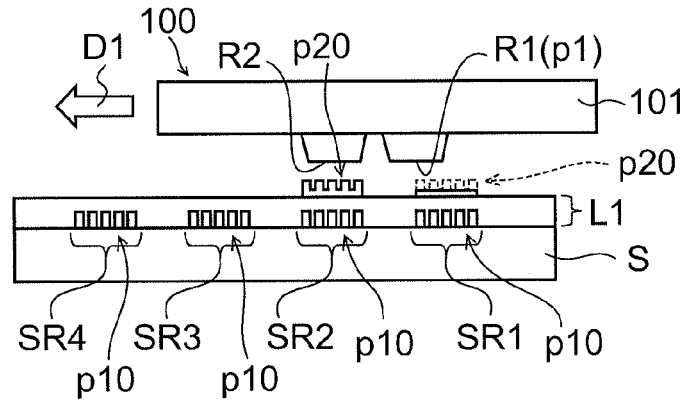

First, as shown in FIG. 6A, the shape of the concave-convex pattern p2 in the second pattern region R2 is transferred to the first shot region SR1 on the substrate S to form the pattern p20. Next, as shown in FIG. 6B, the region for forming the pattern p20 using the second pattern region R2 is moved in the first direction D1 opposite to the second direction D2. The pattern p20 is formed in the second shot region SR2. At this time, the first pattern region R1 of the mold 100 contacts the pattern p20 in the first shot region SR1 where the pattern p20 is previously formed. Therefore, the pattern p20 in the first shot region SR1 results in being destroyed by the first pattern region R1 of the mold 100.

Figure 6C:
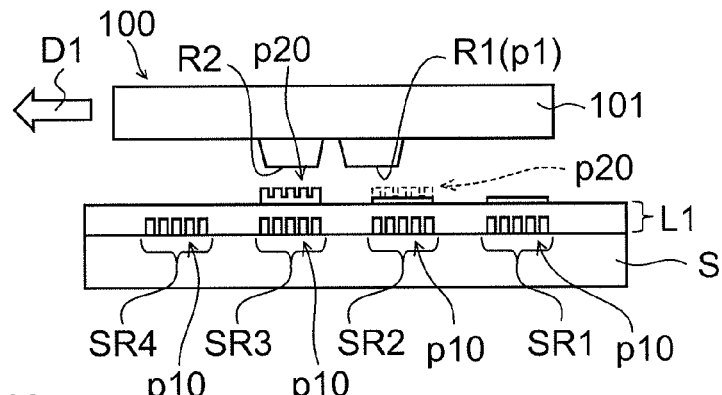

Next, as shown in FIG. 6C, the region for forming the pattern p20 using the second pattern region R2 is moved in the first direction D1. The pattern p20 is formed in the third shot region SR3. At this time, the first pattern region R1 of the mold 100 contacts the pattern p20 in the second shot region SR2 where the pattern p20 is previously formed. Therefore, the pattern p20 in the second shot region SR2 results in being destroyed by the first pattern region R1 of the mold 100.

Figure 6D:
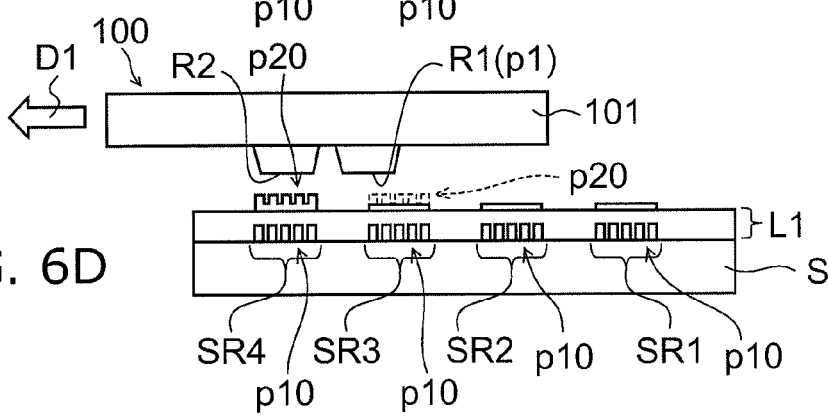

Next, as shown in FIG. 6D, the region for forming the pattern p20 using the second pattern region R2 is moved in the first direction D1. The pattern p20 is formed in the fourth shot region SR4. At this time, the first pattern region R1 of the mold 100 contacts the pattern p20 in the third shot region SR3 where the pattern p20 is previously formed. Therefore, the pattern p20 in the third shot region SR2 results in being destroyed by the first pattern region R1 of the mold 100.

In this way, when the pattern p20 is formed using the second pattern region R2, if the direction in which the pattern 20 is formed is set to the first direction D1 from the first pattern region R1 toward the second pattern region R2, the previously formed pattern p20 results in being destroyed by the first pattern region R1.

Treading like this applies similarly to the case where the pattern p10 is formed using the first pattern region R1. When the pattern p10 is formed using the first pattern region R1, if the direction in which the pattern p10 is formed is set to the second direction D2 from the second pattern region R2 toward the first pattern region R1, the previously formed pattern p10 results in being destroyed by the second pattern region R2.

In contrast to this, in the embodiment, when the pattern p10 is formed using the first pattern region R1, the direction in which the pattern p10 is formed is set to the first direction D1. When the pattern p20 is formed using the second pattern region R2, the direction in which the pattern p20 is formed is set to the second direction D2. This removes treading the previously formed patterns.

FIG. 7 to FIG. 10 are schematic plan views illustrating a first formation order of patterns.

FIG. 7 to FIG. 10 illustrate the first formation order of patterns in the case of using the mold 100 having the first pattern region R1 to the fourth pattern region R4. The patterns are formed on, for example, a wafer W as an objective. A plurality of shot regions are disposed on the wafer W in a matrix configuration. For convenience of description, on the wafer, it is assumed that shot regions are provided, the shot regions being disposed at from the 1st row to the 8th row and at from the 1st column to 11th column, respectively. The shot region disposed at the nth row and the mth column is shown as the shot region SR (n,m). Here, the plurality of shot regions are referred to as the shot regions SR collectively. One shot region corresponds to, for example, one chip region.

The first pattern region R1 is, for example, a region for forming a pattern in the first layer of the shot regions SR. The second pattern SR2 is, for example, a region for forming a pattern in the second layer (a layer on the first layer by one layer) of the shot regions SR. The third pattern region R3 is, for example, a region for forming a pattern in the third layer (a layer on the second layer by one layer) of the shot regions SR. The fourth pattern region R4 is, for example, a region for forming a pattern in the fourth layer (a layer on the third layer by one layer) of the shot regions SR.

Figure 7:
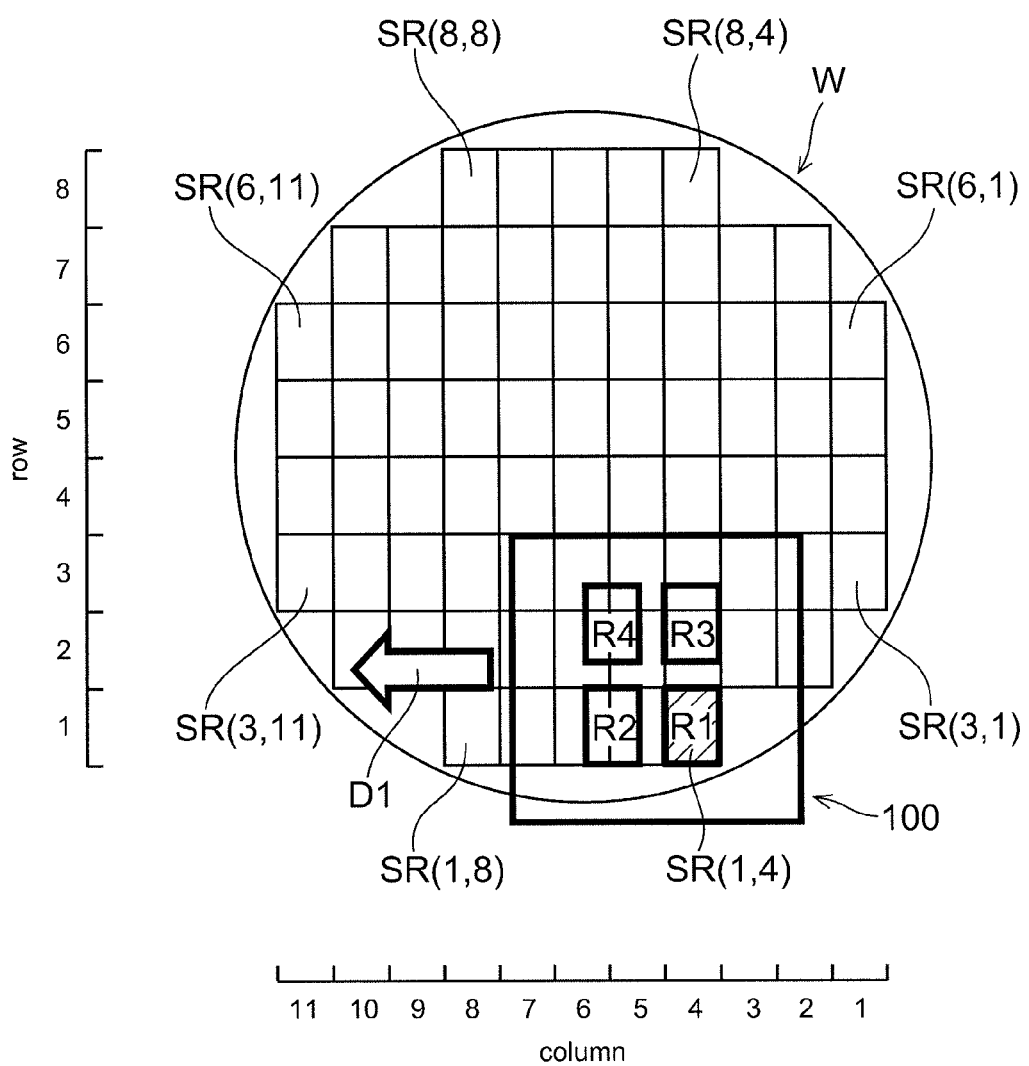
FIG. 7 to FIG. 14 are schematic plan views illustrating a first formation order of patterns.

FIG. 7 shows a direction in the case of forming patterns using the first pattern region R1 of the mold 100. The first pattern region R1 is placed at the lower right of dispositions of the first pattern region R1 to the fourth pattern region R4. When using the first pattern region R1, the pattern formation is started from the shot region SR (1,4) placed at the lowest row and the rightmost column of the wafer W.

The direction in which the patterns are formed is the first direction D1 from the first pattern region R1 toward the second pattern region R2. After forming the pattern in the shot region SR (1,4), the formation is performed in the order of the shot region SR (1,5) adjacent to the shot region SR (1,4) in the first direction D1, the shot region SR (1,6), . . . , the shot region SR (1,8). After forming the patterns from the shot region SR (1,4) to the shot region SR (1,8), a pattern is formed in the shot region SR (2,2) at the row on the first row by one row and the rightmost column. After forming the pattern in the shot region SR (2,2), the formation is performed in the order of the shot region SR (2,2) adjacent to the shot region SR (2,1) in the first direction D1, the shot region SR (2,3), . . . , the shot region SR (2,8), the shot region SR (2,9).

After that, in a similar way, the patterns are formed sequentially in the first direction D1 in the plurality of shot regions SR at the row above one by one. This prevents the previously formed pattern from being destroyed by the second pattern region R2, the third pattern region R3 and the fourth pattern region R4.

Figure 8:
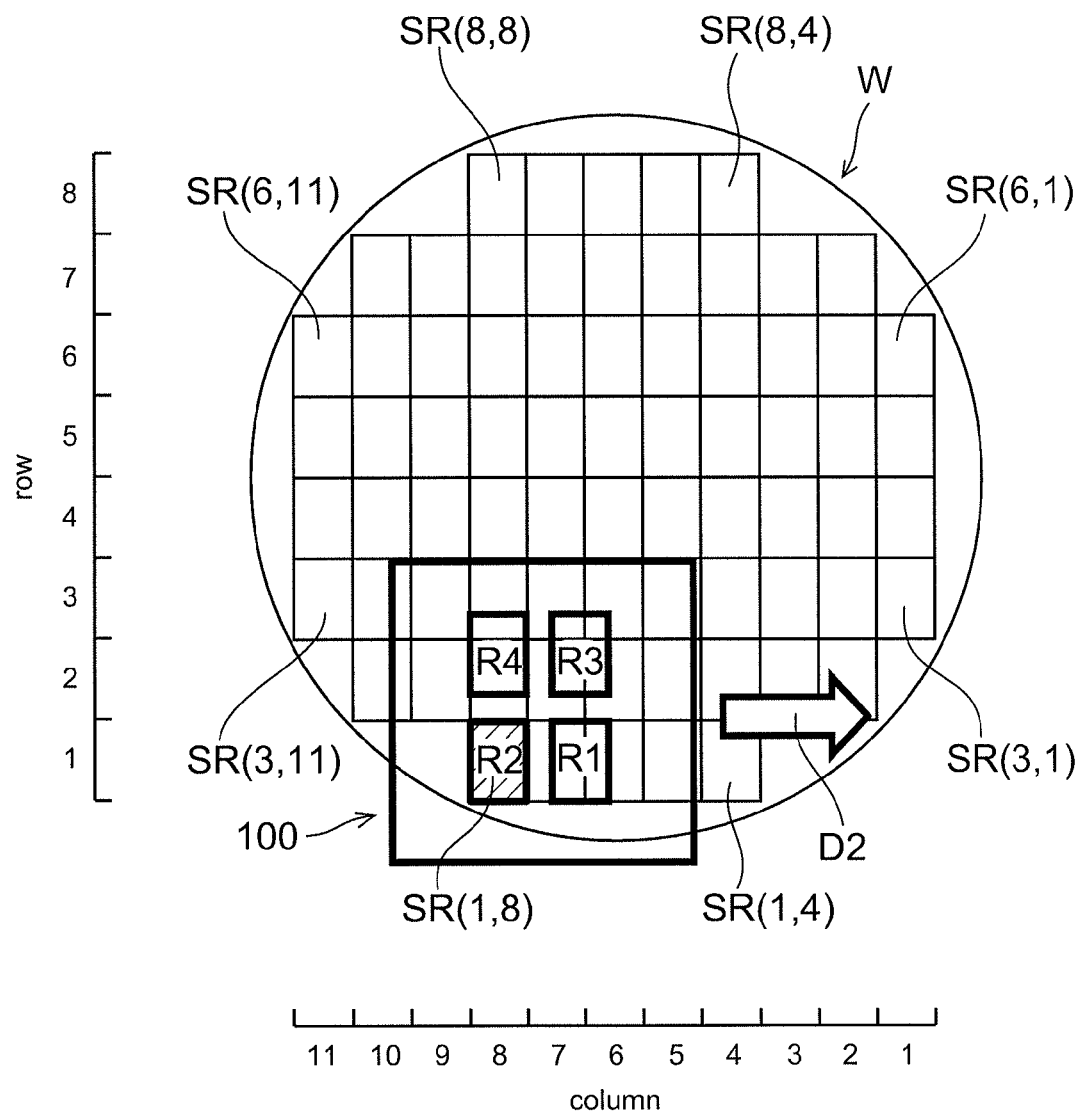

FIG. 8 shows a direction in the case of forming patterns using the second pattern region R2 of the mold 100. The second pattern region R2 is placed at the lower left of dispositions of the first pattern region R1 to the fourth pattern region R4. When using the second pattern region R2, the pattern formation is started from the shot region SR (1,8) placed at the lowest row and the leftmost column of the wafer W.

The direction in which the patterns are formed is the second direction D2 from the second pattern region R2 toward the first pattern region R1. After forming the pattern in the shot region SR (1,8), the formation is performed in the order of the shot region SR (1,7) adjacent to the shot region SR (1,8) in the second direction D2, the shot region SR (1,6), . . . , the shot region SR (1,4). After forming the patterns from the shot region SR (1,8) to the shot region SR (1,4), a pattern is formed in the shot region SR (2,10) at the row on the first row by one row and the leftmost column. After forming the pattern in the shot region SR (2,10), the formation is performed in the order of the shot region SR (2,9) adjacent to the shot region SR (2,10) in the second direction D2, . . . , the shot region SR (2,2).

After that, in a similar way, the patterns are formed sequentially in the second direction D2 in the plurality of shot regions SR at the row above one by one. This prevents the previously formed pattern from being destroyed by the first pattern region R1, the third pattern region R3 and the fourth pattern region R4.

Figure 9:
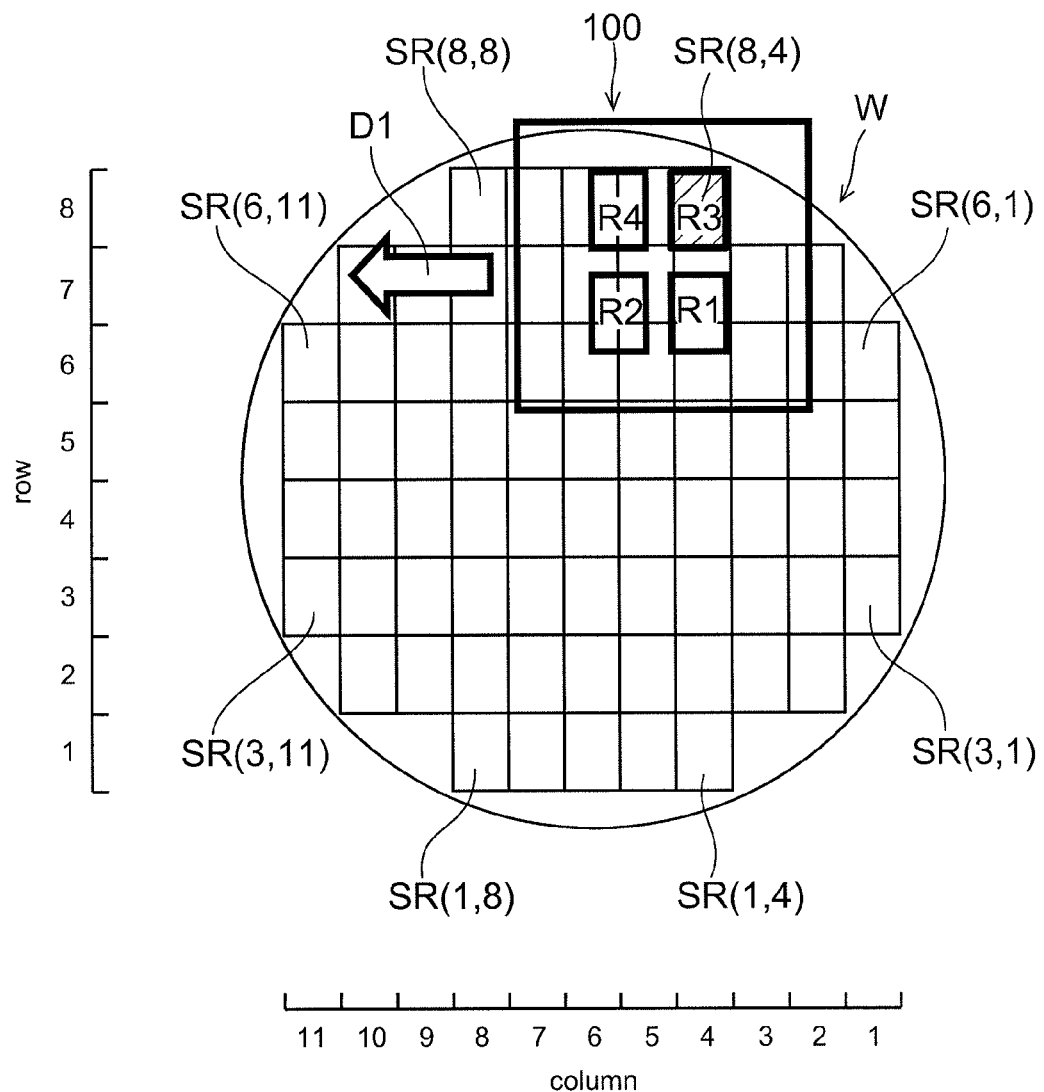

FIG. 9 shows a direction in the case of forming patterns using the third pattern region R3 of the mold 100. The third pattern region R3 is placed at the upper right of dispositions of the first pattern region R1 to the fourth pattern region R4. When using the third pattern region R3, the pattern formation is started from the shot region SR (8,4) placed at the uppermost row and the rightmost column of the wafer W.

The direction in which the patterns are formed is the first direction D1 from the third pattern region R3 toward the fourth pattern region R4. After forming the pattern in the shot region SR (8,4), the formation is performed in the order of the shot region SR (8,5) adjacent to the shot region SR (8,4) in the first direction D1, the shot region SR (8,6), . . . , the shot region SR (8,8). After forming the patterns from the shot region SR (8,4) to the shot region SR (8,8), a pattern is formed in the shot region SR (7,2) at the row below by one row and the rightmost column. After forming the pattern in the shot region SR (7,2), the formation is performed in the order of the shot region SR (7,3) adjacent to the shot region SR (7,2) in the first direction D1, the shot region SR (7,4), . . . , the shot region SR (7,8), the shot region SR (7,9), the shot region SR (7,10).

After that, in a similar way, the patterns are formed sequentially in the first direction D1 in the plurality of shot regions SR at the row below one by one. This prevents the previously formed pattern from being destroyed by the first pattern region R1, the second pattern region R2 and the fourth pattern region R4.

Figure 10:
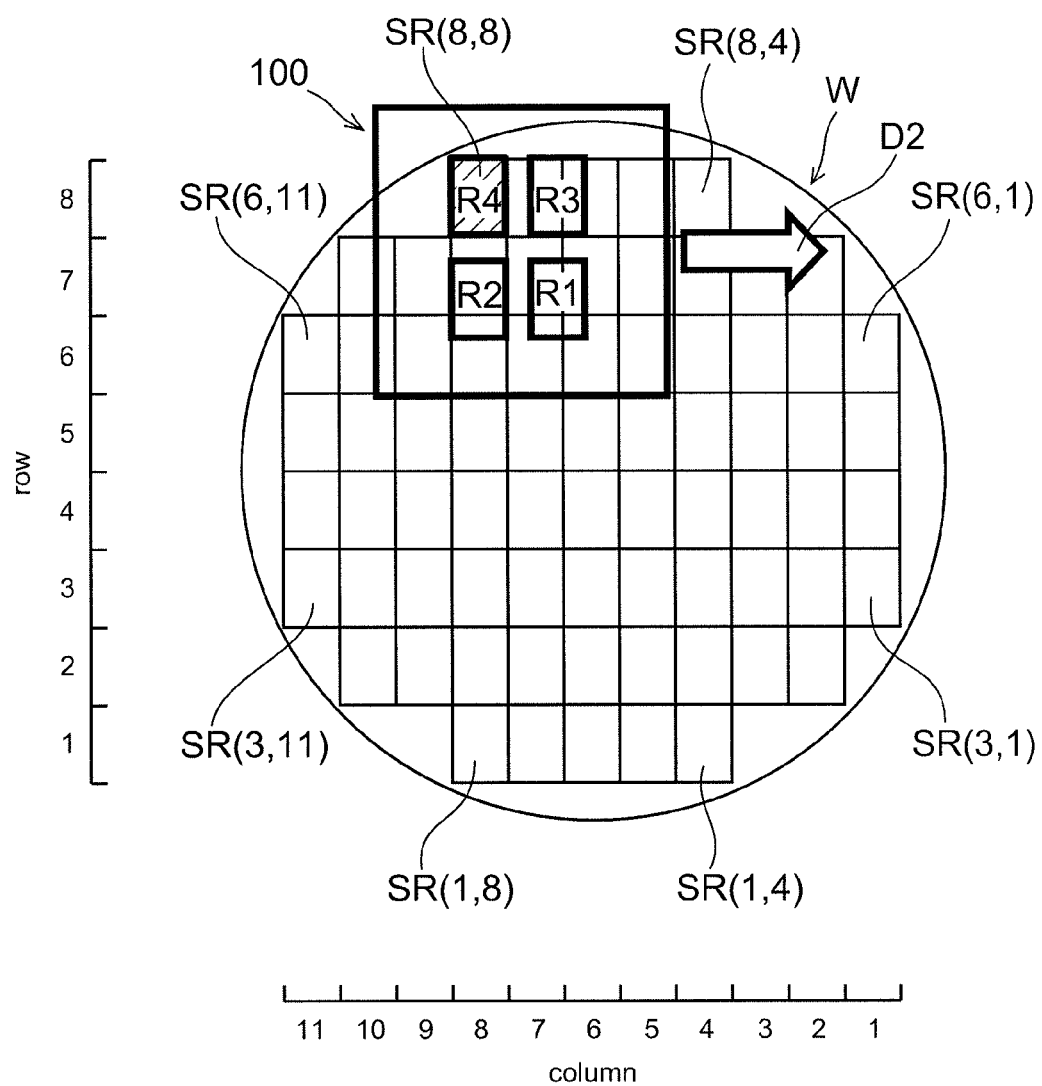

FIG. 10 shows a direction in the case of forming patterns using the fourth pattern region R4 of the mold 100. The fourth pattern region R4 is placed at the upper left of dispositions of the first pattern region R1 to the fourth pattern region R4. When using the fourth pattern region R4, the pattern formation is started from the shot region SR (8,8) placed at the uppermost row and the leftmost column of the wafer W.

The direction in which the patterns are formed is the second direction D2 from the fourth pattern region R4 toward the third pattern region R3. After forming the pattern in the shot region SR (8,8), the formation is performed in the order of the shot region SR (8,7) adjacent to the shot region SR (8,8) in the second direction D2, the shot region SR (8,6), . . . , the shot region SR (8,4). After forming the patterns from the shot region SR (8,8) to the shot region SR (8,4), a pattern is formed in the shot region SR (7,10) at the row below by one row and the leftmost column. After forming the pattern in the shot region SR (7,10), the formation is performed in the order of the shot region SR (7,9) adjacent to the shot region SR (7,10) in the second direction D2, . . . , the shot region SR (7,2).

After that, in a similar way, the patterns are formed sequentially in the second direction D2 in the plurality of shot regions SR at the row below one by one. This prevents the previously formed pattern from being destroyed by the first pattern region R1, the second pattern region R2 and the third pattern region R3.

FIG. 11 to FIG. 14 are schematic plan views illustrating a second formation order of patterns.

FIG. 11 to FIG. 14 illustrate the second formation order of patterns in the case of using the mold 100 having the first pattern region R1 to the fourth pattern region R4.

Figure 11:
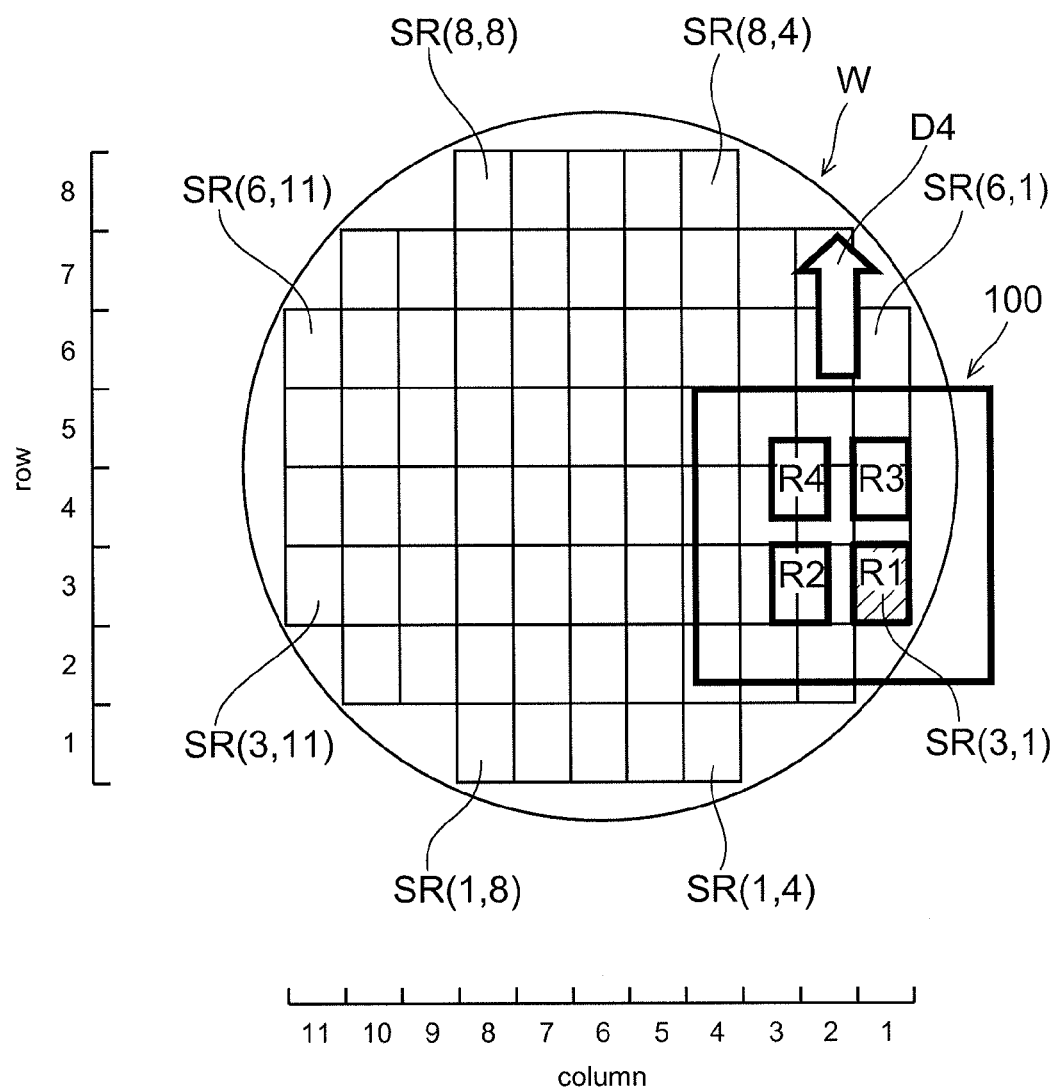

FIG. 11 shows a direction in the case of forming patterns using the first pattern region R1 of the mold 100. When using the first pattern R1, the pattern formation is started from the shot region SR (3,1) placed at the rightmost column and the lowest row of the wafer W.

The direction in which the patterns are formed is the fourth direction D4 from the first pattern region R1 toward the third pattern region R3. After forming the pattern in the shot region SR (3,1), the formation is performed in the order of the shot region SR (4,1) adjacent to the shot region SR (3,1) in the fourth direction D4, the shot region SR (5,1), the shot region SR (6,1). After forming the patterns from the shot region SR (3,1) to the shot region SR (6,1), a pattern is formed in the shot region SR (2,2) at the column left by one column and the lowermost row. After forming the pattern in the shot region SR (2,2), the formation is performed in the order of the shot region SR (3,2) adjacent to the shot region SR (2,2) in the fourth direction D4, the shot region SR (4,2), . . . , the shot region SR (6,2), the shot region SR (7,2).

After that, in a similar way, the patterns are formed sequentially in the fourth direction D4 in the plurality of shot regions SR at the column left one by one. This prevents the previously formed pattern from being destroyed by the second pattern region R2, the third pattern region R3 and the fourth pattern region R4.

Figure 12:
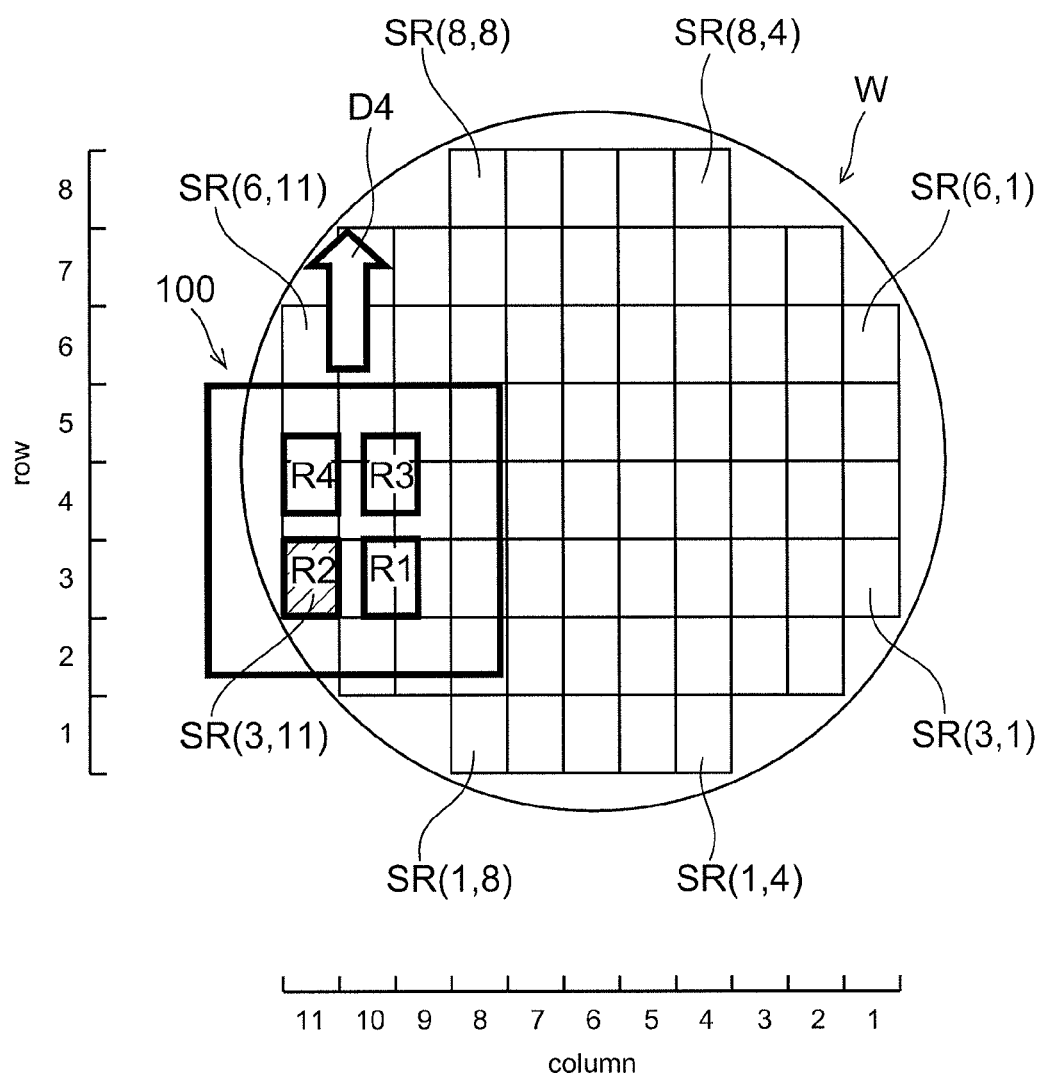

FIG. 12 shows a direction in the case of forming patterns using the second pattern region R2 of the mold 100. When using the second pattern R2, the pattern formation is started from the shot region SR (3,11) placed at the leftmost column and the lowest row of the wafer W.

The direction in which the patterns are formed is the fourth direction D4 from the second pattern region R2 toward the fourth pattern region R4. After forming the pattern in the shot region SR (3,11), the formation is performed in the order of the shot region SR (4,11) adjacent to the shot region SR (3,11) in the fourth direction D4, the shot region SR (5,11), the shot region SR (6,11). After forming the patterns from the shot region SR (3,11) to the shot region SR (6,11), a pattern is formed in the shot region SR (2,10) at the column right by one column and the lowermost row. After forming the pattern in the shot region SR (2,10), the formation is performed in the order of the shot region SR (3,10) adjacent to the shot region SR (2,10) in the fourth direction D4, the shot region SR (4,10), . . . , the shot region SR (6,10), the shot region SR (7,10).

After that, in a similar way, the patterns are formed sequentially in the fourth direction D4 in the plurality of shot regions SR at the column right one by one. This prevents the previously formed pattern from being destroyed by the first pattern region R1, the third pattern region R3 and the fourth pattern region R4.

Figure 13:
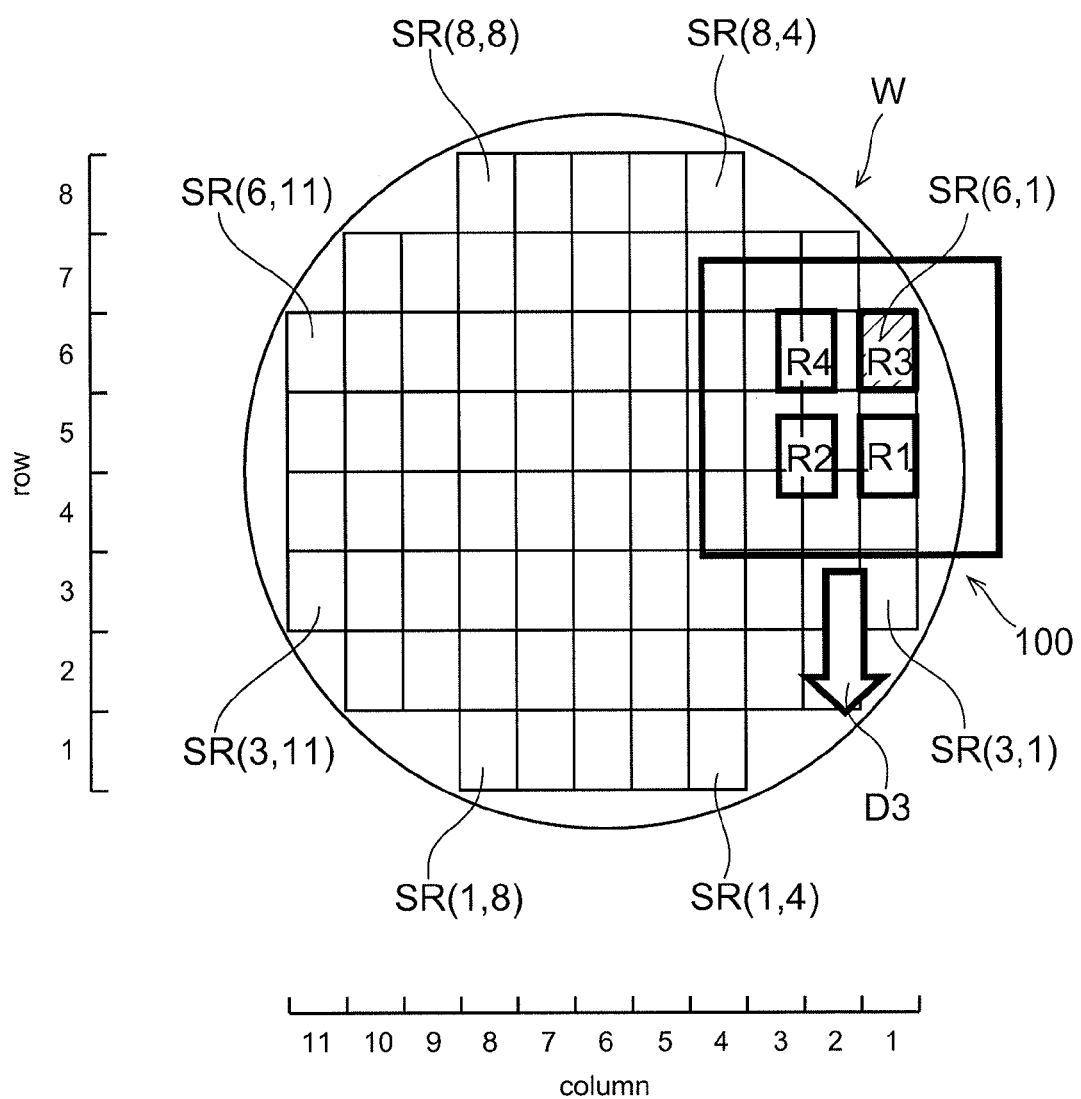

FIG. 13 shows a direction in the case of forming patterns using the third pattern region R3 of the mold 100. When using the third pattern R3, the pattern formation is started from the shot region SR (6,1) placed at the rightmost column and the uppermost row of the wafer W.

The direction in which the patterns are formed is the third direction D3 from the third pattern region R3 toward the first pattern region R1. After forming the pattern in the shot region SR (6,1), the formation is performed in the order of the shot region SR (5,1) adjacent to the shot region SR (6,1) in the fourth direction D4, the shot region SR (5,1), the shot region SR (4,1), the shot region SR (3,1). After forming the patterns from the shot region SR (6,1) to the shot region SR (3,1), a pattern is formed in the shot region SR (7,2) at the column left by one column and the uppermost row. After forming the pattern in the shot region SR (7,2), the formation is performed in the order of the shot region SR (6,2) adjacent to the shot region SR (7,2) in the fourth direction D4, the shot region SR (5,2), . . . , the shot region SR (3,2), the shot region SR (2,2).

After that, in a similar way, the patterns are formed sequentially in the third direction D3 in the plurality of shot regions SR at the column left one by one. This prevents the previously formed pattern from being destroyed by the first pattern region R1, the second pattern region R2 and the fourth pattern region R4.

Figure 14:
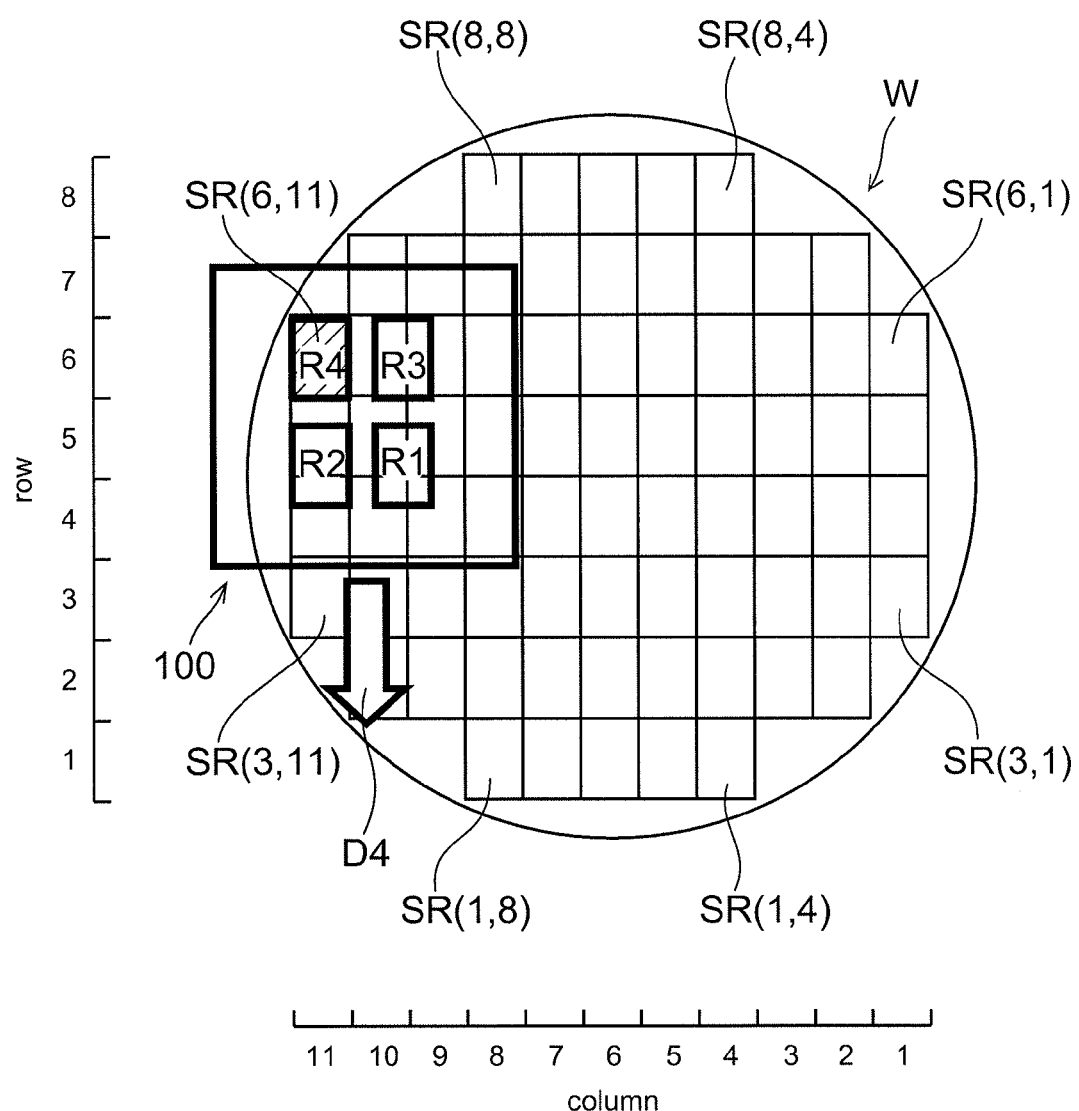

FIG. 14 shows a direction in the case of forming patterns using the fourth pattern region R4 of the mold 100. When using the fourth pattern R4, the pattern formation is started from the shot region SR (6,11) placed at the leftmost column and the uppermost row of the wafer W.

The direction in which the patterns are formed is the fourth direction D4 from the fourth pattern region R4 toward the second pattern region R2. After forming the pattern in the shot region SR (6,11), the formation is performed in the order of the shot region SR (5,11) adjacent to the shot region SR (6,11) in the fourth direction D4, the shot region SR (5,11), the shot region SR (4,11), the shot region SR (3,11). After forming the patterns from the shot region SR (6,11) to the shot region SR (3,11), a pattern is formed in the shot region SR (7,10) at the column right by one column and the uppermost row. After forming the pattern in the shot region SR (7,10), the formation is performed in the order of the shot region SR (6,10) adjacent to the shot region SR (7,10) in the fourth direction D4, the shot region SR (5,10), . . . , the shot region SR (3,10), the shot region SR (2,10).

After that, in a similar way, the patterns are formed sequentially in the fourth direction D4 in the plurality of shot regions SR at the column right one by one. This prevents the previously formed pattern from being destroyed by the first pattern region R1, the second pattern region R2 and the third pattern region R3.

Figure 15:
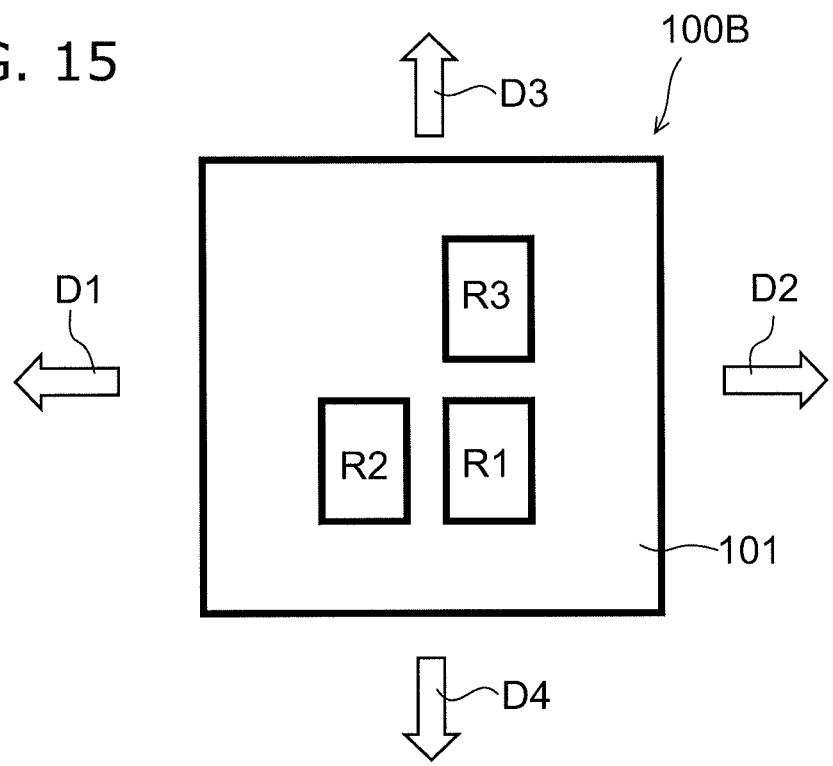
FIG. 15 to FIG. 16 are schematic plan views illustrating another disposition of pattern regions.
Figure 16:
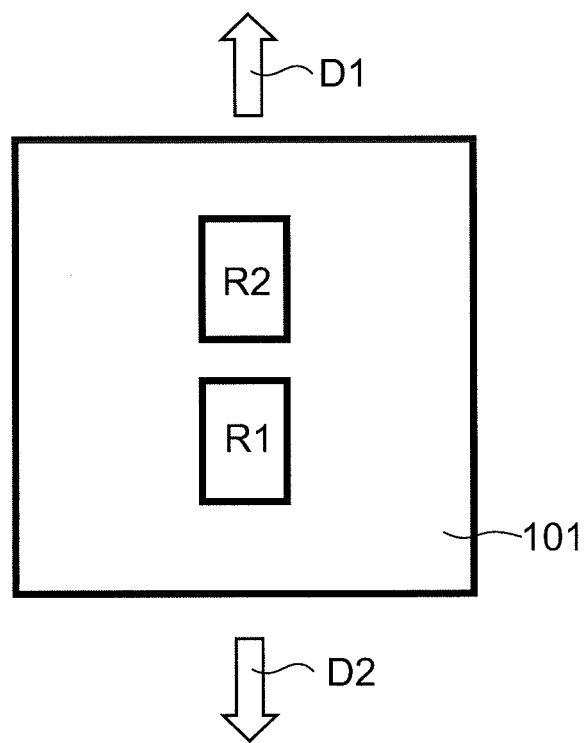

FIG. 15 and FIG. 16 are schematic plan views illustrating another disposition of pattern regions.

A mold 100B shown in FIG. 15 has the first pattern R1, the second pattern R2 and the third pattern region R3. The mold 100B is not provided with the fourth pattern region R4. The second pattern region R2 is aligned with the first pattern region R1. The third pattern region R3 is aligned with the first pattern region R1. A line connecting the first pattern region R1 to the third pattern region R3 is orthogonal to a line connecting the first pattern region R1 to the second pattern region R2.

When patterns are formed using the first pattern region R1 of the mold 100B, a pattern is formed in each of the plurality of shot regions sequentially in the first direction D1 starting from the first pattern region R1 toward the second pattern region R2.

When patterns are formed using the first pattern region R1 of the mold 100B, a pattern may be formed in each of the plurality of shot regions sequentially in the third direction D3 starting from the first pattern region R1 toward the third pattern region R3.

When patterns are formed using the second pattern region R2 of the mold 100B, a pattern is formed in each of the plurality of shot regions sequentially in the second direction D2 starting from the first pattern region R1 toward the second pattern region R2.

When patterns are formed using the third pattern region R3 of the mold 100B, a pattern is formed in each of the plurality of shot regions sequentially in the fourth direction D4 starting from the third pattern region R3 toward the first pattern region R1.

If the shape of the pattern is transferred to each of the plurality of shot regions in the order like this, the pattern is formed surely without treading the previously formed pattern by the mold 100B.

A mold 100C shown in FIG. 16 has the first pattern region R1 and the second pattern region R2. The mold 100c is not provided with the third pattern region R3 and the fourth pattern region R4. The second pattern region r2 is aligned with the first pattern region R1.

When patterns are formed using the first pattern region R1 of the mold 100C, a pattern is formed in each of the plurality of shot regions sequentially in the first direction D1 starting from the first pattern region R1 toward the second pattern region R2.

When patterns are formed using the second pattern region R2 of the mold 100C, a pattern is formed in each of the plurality of shot regions sequentially in the second direction D2 starting from the first pattern region R1 toward the second pattern region R2.

If the shape of the pattern is transferred to each of the plurality of shot regions in the order like this, the pattern is formed surely without treading the previously formed pattern by the mold 100C.

In the molds 100, 100B and 100C described above, all of the shape of the concave-convex pattern of each of the plurality of regions may be the same. If all of the shape of the concave-convex pattern in each of the plurality of pattern regions is the same, the pattern is formed in the shot region using one pattern region of the plurality of pattern regions. If the concave-convex pattern of selected one pattern region is broken or so, the pattern is formed using the concave-convex pattern in another pattern region. This allows the same pattern to be formed for a long time without exchanging the mold.

For example, when a replica mold is ordinarily formed from one sheet of mother mold, the mother mold should be abandoned even for a break of one concave-convex pattern in the mother mold. As described above, if the plurality of pattern regions are provided in the mother mold and the same concave-convex pattern is formed in each pattern region, the replica mold can be formed using another pattern even if the concave-convex pattern in one pattern region is broken.

Second Embodiment

Figure 17:
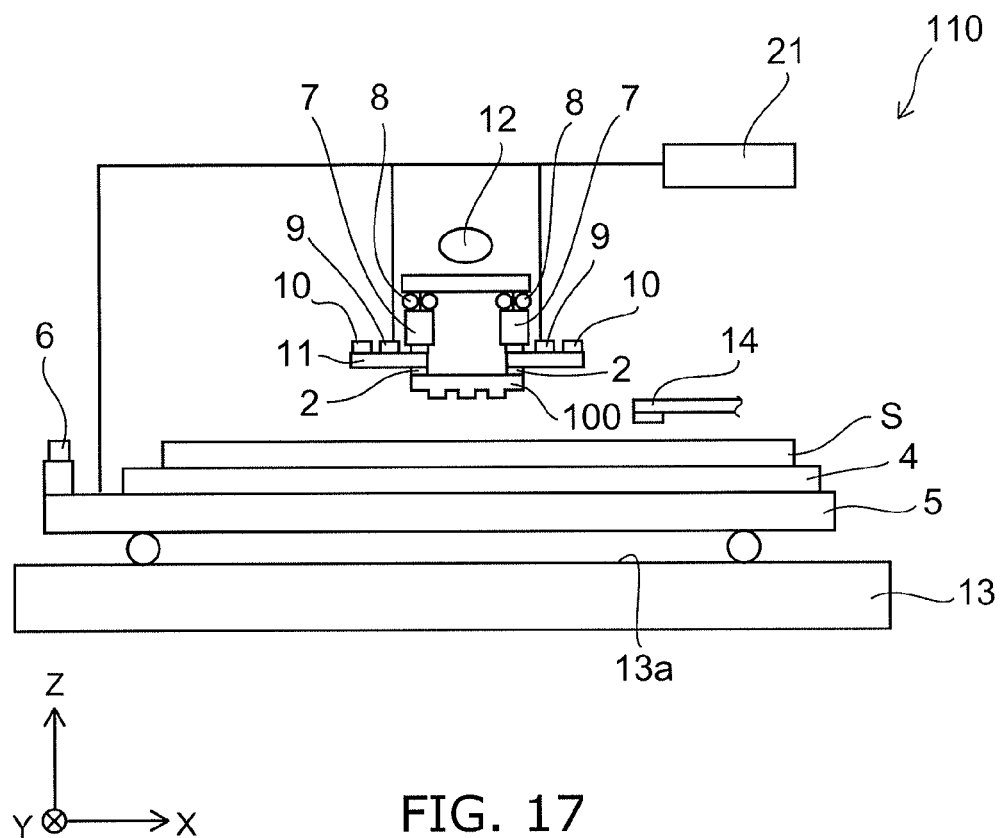
FIG. 17 is a schematic view illustrating the configuration of a pattern formation device according to a second embodiment.

FIG. 17 is a schematic view illustrating the configuration of a pattern formation device according to a second embodiment.

As shown in FIG. 17, a pattern formation device 110 includes a mold holder 2, a substrate holder 5, an alignment unit 9, an applying unit 14, a drive unit 8, a light emitting unit 12, and a control unit 21. The pattern formation device 110 further includes an alignment sensor 7 and a pressure unit 10. The pattern formation device 110 according to the embodiment is an imprint device configured to transfer the shape of the concave-convex pattern of the mold 100 to the resin on the substrate S.

The substrate is one example of an object. The shape of the pattern is transferred to the object. The substrate S is, for example, a semiconductor substrate and a glass substrate. An underlying pattern is formed on the substrate S. The substrate S may include a film formed on the underlying pattern. The film is at least one of an insulating film, a metal film (conductive film) and a semiconductor film. A resin is applied onto the substrate S when transferring.

The substrate holder (second holder) 5 is provided on a stage platen 13 to be movable. The substrate holder 5 is provided to be movable along each of two axes along an upper surface 13a on the stage platen 13. Here, the two axes along the upper surface 13a of the stage platen 13 are taken as an X-axis and a Y-axis. The substrate holder 5 is provided to be movable also along a Z-axis orthogonal to the X-axis and the Y-axis. It is desired that the substrate holder 5 is provided to be rotatable around each of the X-axis, the Y-axis and the Z-axis.

The substrate holder 5 is provided with a reference mark stage 6. A reference mark (not shown) serving as a reference position of the device is placed the reference mark stage 6. The reference mark is constituted from, for example, a diffraction lattice. The reference mark is used for calibration of the alignment sensor 7 and positioning (attitude control/adjustment) of the mold 100. The reference mark is an original point on the substrate holder 5. An X-Y coordinate of the substrate S placed on the substrate holder 5 serves as a coordinate having the reference mark stage 6 as the original point.

The mold holder (first holder) 2 fixes the mold 100. The mold holder 2 holds a peripheral portion of the mold 100 by, for example, vacuum chuck. Here, the mold 100 is formed from materials transmissive to a ultra-violet ray such as quartz or fluoric. A transfer pattern made of concave-convex formed on the mold 100 includes a pattern corresponding to a device pattern and a pattern corresponding to the alignment mark used for positioning the mold 100 and the substrate S.

The mold holder 2 operates so as to position the mold 100 to a device reference. The mold holder 2 is attached to a base unit 11.

The alignment unit 9 and the pressure unit 10 (actuator) are attached to the base unit 11. The alignment unit 9 is equipped with adjustment mechanism fine-tuning the position (attitude) of the mold 100. The alignment unit 9 corrects a relative position between the mold 100 and the substrate S by fine-tuning the position (attitude) of the mold 100. The alignment unit 9 takes directions, for example, from the control unit 21 to position the substrate S and the mold 100 and to fine-tune the position of the mold 100.

The pressure unit 10 applies a stress to a side surface of the mold 100 to twist the mold 100 out of shape. In the case of the rectangular mold 100, the pressure unit 100 pressures the mold 100 from four side surfaces of the mold 100 toward the center. Thereby, positioning of the mold 100 is performed. The balance pushing the mold 100 causes the pressure unit 10 to deform the mold 100. The pressure unit 10 takes directions from, for example, from the control unit 21 to pressure the mold 100 by a prescribed pressure.

The alignment sensor 7 detects a second alignment mark provided on the mold 100 and a first alignment mark provided on the substrate S. The alignment sensor 7 includes, for example, an optical camera. An amount of relative positional displacement between the first alignment mark and the second alignment mark is determined from an image signal taken in by the optical camera.

The alignment sensor 7 detects the positional displacement of the mold 100 to the reference mark on the reference mark stage 6 and the positional displacement of the mold 100 referenced to the substrate S. The positions (for example, X-Y coordinate) of the first alignment mark and the second alignment mark detected by the alignment sensor 7 are sent to the control unit 21. The alignment sensor 7 may be either fixed type or movable type.

The control unit 21 operates the displacement amount based on position information of the first alignment mark and the second alignment mark detected by the alignment sensor 7. The alignment unit 9 adjusts alignment of the substrate S and the mold 100 based on the signal sent from the control unit 21.

The control unit 21 controls a light emitting unit 12. In forming the pattern by the imprint method, after applying the resin 15 on the substrate S, the resin is irradiated with light from the light emitting unit 12 in a state where the concave-convex pattern of the mold 100 is in contact with the resin 15. The control unit 21 controls irradiation timing and irradiance level of the light.

The light emitting unit 12 emits, for example, a ultra-violet ray. The light emitting unit 12 is placed, for example, directly on the mold 100. The position of the light emitting unit 12 is not limited to directly on the mold 100. In the case where the light emitting unit 12 is disposed at a position other than directly on the mold 100, it is only necessary to configure to set an optical path using an optical member such as a mirror etc. to emit the light emitted from the light emitting unit 12 from directly on the mold 100 toward the mold 100.

The applying unit 14 applies the resin 15 onto the substrate S. The applying unit 14 includes a nozzle, and drops the resin 15 to the substrate S from the nozzle.

The drive unit 8 drives the mold holder 2 and the substrate holder 5. The drive unit 8 drives at least one of the mold holder 2 and the substrate holder 5 to change the relative positional relationship between the mold 100 and the substrate S.

The control unit 21 of the pattern formation device 110 controls the light emitted toward the resin 15 in a state where the concave-convex pattern of the mold 100 is in contact with the resin 15. The control unit 21 controls the drive unit 8 and the light emitting unit 12 or the like so as to form patterns in the plurality of shot regions in the order previously described. That is, the control unit 21 performs processes of the step S101 to the step S108 shown in FIG. 1.

According to the pattern formation device 110, pattern formation is surely performed not to destroy the previously formed pattern by the mold 100.

Third Embodiment

The pattern formation method according to the first embodiment described above is feasible as a program (pattern formation program) executed by a computer.

Figure 18:
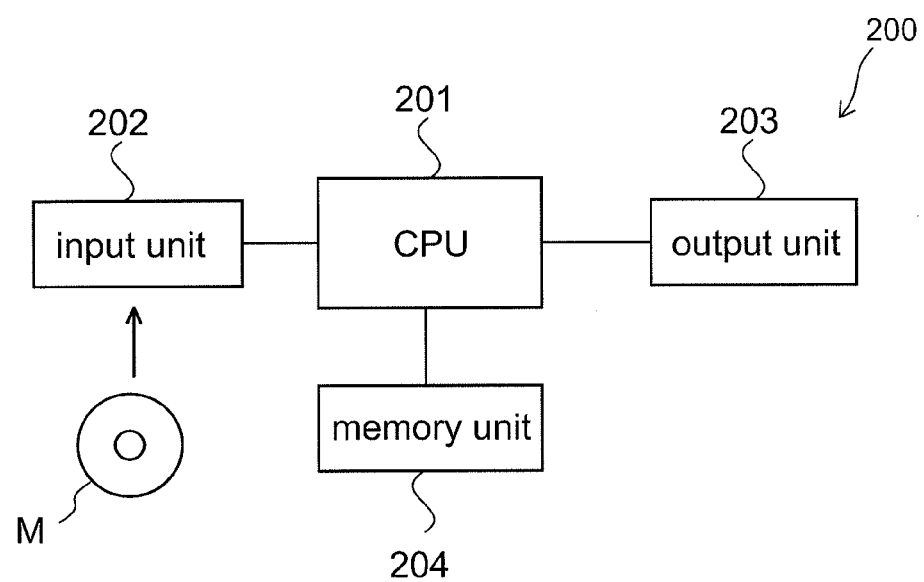
FIG. 18 illustrates the hard ware configuration of a computer.

FIG. 18 illustrates the hardware configuration of a computer.

A computer 200 includes a central processing unit 201, an input unit 202, an output unit 203, and a memory unit 204. The input unit 202 includes a function to read out information recorded in a record medium M. The alignment program is executed by the central processing unit 201.

The pattern formation program makes the computer 200 execute the processes of the step S101 to step S108 shown in FIG. 1.

Fourth Embodiment

The pattern formation program may be recorded in the record medium capable of being read out by a computer. The record medium M stores processes of the step S101 to the step S108 shown in FIG. 1 in a scheme in which the processes can be read out by the computer 200. The pattern formation program may be distributed via the network.

As described above, according to the pattern formation method and the pattern formation device according to the embodiments, patterns can be formed surely without destruction of the previously formed pattern by the mold.

Although the embodiment and modifications thereof are described above, the invention is not limited to these examples. For example, additions, deletions, or design modifications of components or appropriate combinations of the features of the embodiments appropriately made by one skilled in the art in regard to the embodiments or the modifications thereof described above are within the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern formation method configured to transfer a shape of a pattern to a plurality of shot regions of an object using a mold including a first pattern region and a second pattern region aligned with the first pattern region, the method comprising:

transferring the shape of the pattern to each of the plurality of shot regions sequentially in a first direction from the first pattern region toward the second pattern region when the shape of the pattern is transferred using the first pattern region; and transferring the shape of the pattern to each of the plurality of shot regions sequentially in a second direction from the second pattern region toward the first pattern region when the shape of the pattern is transferred using the second pattern region.

2. The method according to claim 1, wherein the shape of the pattern provided in the first pattern region is different from the shape of the pattern provided in the second pattern.

3. The method according to claim 1, wherein the shape of the pattern provided in the first pattern region is same as the shape of the pattern provided in the second pattern.

4. The method according to claim 1, wherein a distance between the two adjacent shot regions of the plurality of shot regions is different from a distance between the first pattern region and the second pattern region.

5. The method according to claim 1, wherein the mold further includes a third pattern region aligned with the first pattern region in a direction orthogonal to the first direction, and the shape of the pattern is transferred to each of the plurality of shot regions sequentially in a third direction from the third pattern region toward the first pattern region when the shape of the pattern is transferred using the third pattern.

6. The method according to claim 5, wherein the shape of the pattern provided in the first pattern region, the shape of the pattern provided in the second pattern region, and the shape of the third pattern region are mutually different.

7. The method according to claim 5, wherein the shape of the pattern provided in the first pattern region, the shape of the pattern provided in the second pattern region, and the shape of the third pattern region are mutually same.

8. The method according to claim 5, wherein the shape of the pattern is transferred to a first layer of the object using the first pattern region, the shape of the pattern is transferred to a second layer on the first layer of the object using the second pattern region, and the shape of the pattern is transferred to a third layer on the second layer of the object using the third pattern region.

9. The method according to claim 1, wherein the mold further includes a third pattern region aligned with the first pattern region in a direction orthogonal to the first direction, and a fourth pattern region aligned with the second pattern region in the direction orthogonal to the first direction, the shape of the pattern is transferred to each of the plurality of shot regions sequentially in a third direction from the third pattern region toward the first pattern region when the shape of the pattern is transferred using the third pattern, and the shape of the pattern is transferred to each of the plurality of shot regions sequentially in the third direction when the shape of the pattern is transferred using the fourth pattern.

10. The method according to claim 9, wherein the shape of the pattern provided in the first pattern region, the shape of the pattern provided in the second pattern region, the shape of the third pattern region, and the shape of the fourth pattern region are mutually different.

11. The method according to claim 9, wherein the shape of the pattern provided in the first pattern region, the shape of the pattern provided in the second pattern region, the shape of the third pattern region, and the shape of the fourth pattern region are mutually same.

12. The method according to claim 9, wherein
the shape of the pattern is transferred to a first layer of the object using the first pattern region,
the shape of the pattern is transferred to a second layer on the first layer of the object using the second pattern region,
the shape of the pattern is transferred to a third layer on the second layer of the object using the third pattern region, and
the shape of the pattern is transferred to a fourth layer on the third layer of the object using the fourth pattern region.

13. The method according to claim 1, wherein
the shape of the pattern is transferred to a first layer of the object using the first pattern region, and
the shape of the pattern is transferred to a second layer on the first layer of the object using the second pattern region.

* * * * *